US011380585B2

(12) United States Patent
Ueno et al.

(10) Patent No.: US 11,380,585 B2
(45) Date of Patent: Jul. 5, 2022

(54) SEMICONDUCTOR DEVICE MANUFACTURING METHOD

(71) Applicant: Mitsubishi Electric Corporation, Tokyo (JP)

(72) Inventors: Ryuji Ueno, Tokyo (JP); Masatoshi Sunamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/550,801

(22) PCT Filed: Apr. 20, 2015

(86) PCT No.: PCT/JP2015/062006
§ 371 (c)(1),
(2) Date: Aug. 14, 2017

(87) PCT Pub. No.: WO2016/170579
PCT Pub. Date: Oct. 27, 2016

(65) Prior Publication Data
US 2018/0033694 A1    Feb. 1, 2018

(51) Int. Cl.
*H01L 21/78*    (2006.01)
*H01L 21/02*    (2006.01)
*B82Y 40/00*    (2011.01)

(52) U.S. Cl.
CPC ........ *H01L 21/78* (2013.01); *H01L 21/02019* (2013.01); *B82Y 40/00* (2013.01); *H01L 21/02068* (2013.01)

(58) Field of Classification Search
CPC ............... H01L 21/78; H01L 21/02019; H01L 21/02068; B82Y 40/00
(Continued)

(56) References Cited

U.S. PATENT DOCUMENTS 6,803,294 B2 * 10/2004 Kouno ............. H01L 29/66333
                                                    257/E21.237
6,987,320 B2 *  1/2006 Miyachi ............... H01L 23/373
                                                    257/746
(Continued)

FOREIGN PATENT DOCUMENTS

JP    2007-173487 A    7/2007
JP    2009-224511 A    10/2009
(Continued)

OTHER PUBLICATIONS

English abstract WO2009142077, 19 pages, retrieved from the internet from https://patents.google.com/patent/WO2009142077A1/en on Jan. 5, 2018.*
(Continued)

*Primary Examiner* — Duy T Nguyen
(74) *Attorney, Agent, or Firm* — Studebaker & Brackett PC

(57) ABSTRACT

A semiconductor device manufacturing method includes thinning a wafer to form a wafer having an annular protruding portion on a peripheral portion thereof by grinding a central portion of a back surface of the wafer and then performing wet etching on the back surface of the wafer, forming a backside electrode on the back surface of the wafer, performing plating to evenly form a metal film on a portion of the backside electrode on the annular protruding portion, attaching a dicing tape to the metal film, and dicing the wafer having the dicing tape attached thereto.

5 Claims, 5 Drawing Sheets

(58) Field of Classification Search
USPC .......................................................... 438/460
See application file for complete search history.

(56) References Cited

U.S. PATENT DOCUMENTS

| | | | | |
|---|---|---|---|---|
| 7,148,125 | B2* | 12/2006 | Suzuki | H01L 29/0657 438/459 |
| 7,622,328 | B2* | 11/2009 | Masuda | B28D 5/0029 257/E21.237 |
| 2003/0119281 | A1* | 6/2003 | Suzuki | H01L 29/7813 438/460 |
| 2003/0215985 | A1* | 11/2003 | Kouno | H01L 21/78 438/135 |
| 2004/0066610 | A1* | 4/2004 | Miyachi | H01L 24/83 361/820 |
| 2005/0170555 | A1 | 8/2005 | Hirano et al. | |
| 2007/0034250 | A1* | 2/2007 | Dutta | H01L 31/03046 136/244 |
| 2007/0141955 | A1 | 6/2007 | Masuda | |
| 2008/0242052 | A1* | 10/2008 | Feng | H01L 21/3043 438/459 |
| 2008/0252172 | A1* | 10/2008 | Yetter | B06B 1/0629 310/317 |
| 2011/0180902 | A1* | 7/2011 | Inagawa | H01L 29/0696 257/577 |
| 2012/0018191 | A1* | 1/2012 | Yoshida | C23C 18/1655 174/126.2 |
| 2014/0070374 | A1 | 3/2014 | Numaguchi | |
| 2016/0027648 | A1 | 1/2016 | Urano | |
| 2016/0108254 | A1* | 4/2016 | Koyama | C09D 5/24 257/753 |
| 2017/0333989 | A1* | 11/2017 | Mori | C22C 19/03 |
| 2018/0033694 | A1* | 2/2018 | Ueno | H01L 21/78 |

FOREIGN PATENT DOCUMENTS

| | | |
|---|---|---|
| JP | 2010-016188 A | 1/2010 |
| JP | 2011-222843 A | 11/2011 |
| JP | 2013-194291 A | 9/2013 |
| JP | 2013-232582 A | 11/2013 |
| JP | 2014-053549 A | 3/2014 |
| WO | 2009/142077 A1 | 11/2009 |
| WO | 2015/045617 A1 | 4/2015 |

OTHER PUBLICATIONS

Wikipedia "Plating," 1 p. Retrieved from the internet at https://en.wikipedia.org/wiki/Plating on May 24, 2018. (Year: 2018).*

English translation Inagawa JP2011222843 5pp retrieved from internet on Aug. 6, 2019: https://patents.google.com/patent/JP2011222843A/en?oq=2011-222843 (Year: 2019).*

Alkaline Degreaser for Aluminum Electrode on Semiconductor Wafer, ITO and Glass Melcleaner SC-7001; 3pp, retrieved from internet on Jan. 31, 2021 from https://www.meltex.com/en_products_search/item_2 (Year: 2021).*

Notification of Transmittal of Copies of Translation of the International Preliminary Report on Patentability and Translation of Written Opinion of the International Searching Authority; PCT/JP2015/062006; dated Nov. 2, 2017.

International Search Report issued in PCT/JP2015/062006; dated May 26, 2015.

An Office Action issued by the Japanese Patent Office dated Jan. 16, 2018, which corresponds to Japanese Patent Application No. 2017-513849 and is related to U.S. Appl. No. 15/550,801; with English translation.

An Office Action mailed by the State Intellectual Property Office of the People's Republic of China dated Jan. 19, 2020, which corresponds to Chinese Patent Application No. 201580079099.1 and is related to U.S. Appl. No. 15/550,801.

An Office Action mailed by the German Patent Office dated Apr. 10, 2020, which corresponds to German Patent Application No. 112015006472.9 and is related to U.S. Appl. No. 15/550,801; with English language translation.

An Office Action mailed by China National Intellectual Property Administration dated Aug. 17, 2020, which corresponds to Chinese Patent Application No. 201580079099.1 and is related to U.S. Appl. No. 15/550,801 with English language translation.

An Office Action mailed by China National Intellectual Property Administration dated Jun. 11, 2021 which corresponds to Chinese Patent Application No. 201580079099.1 and is related to U.S. Appl. No. 15/550,801 with English language translation.

An Office Action mailed by China National Intellectual Property Administration dated Mar. 3, 2021, which corresponds to Chinese Patent Application No. 201580079099.1 and is related to U.S. Appl. No. 15/550,801; with English language translation.

An Office Action mailed by China National Intellectual Property Administration dated Sep. 6, 2021 which corresponds to Chinese Patent Application No. 201580079099.1 and is related to U.S. Appl. No. 15/550,801; with English language translation.

Chang Qing et al.; "Introduction to Microelectronics Technology"; National Defense Press (2006); Mar. 2006; p. 72; English translation of the Chinese Office Action as a concise explanation of relevance is submitted herewith.

An Office Action mailed by China National Intellectual Property Administration dated Mar. 8, 2022, which corresponds to Chinese Application No. 201580079099.1 and is related to U.S. Appl. No. 15/550,801; with English language translation.

An Office Action mailed by China National Intellectual Property Administration dated Apr. 29, 2022, which corresponds to Chinese Application No. 201580079099.1 and is related to U.S. Appl. No. 15/550,801; with English language translation.

* cited by examiner

SEMICONDUCTOR DEVICE MANUFACTURING METHOD

TECHNICAL FIELD

This invention relates to a semiconductor device manufacturing method including the step of dicing a wafer.

BACKGROUND

Vertical-conduction semiconductor devices such as IGBTs (insulated-gate bipolar transistors) and diodes use a thinned wafer to achieve low resistance when energized and to improve electrical-voltage characteristics. Presently, the thickness thereof is reduced to approximately 50 μm in some cases. To reduce the thickness of a wafer, a protecting member such as a tape is attached to a surface of the wafer, and the back side of the wafer is mechanically ground. After that, a defect layer produced by the mechanical grinding is removed by wet etching.

A wafer thinned to a thickness of, for example, 130 μm or less is likely to be severely warped and to be cracked or chipped. In some cases, to avoid such negative effects, an inner portion (central portion) of the wafer is thinned by mechanical grinding with a peripheral portion of the wafer kept thick. Keeping the peripheral portion of the wafer thick improves the rigidity of the wafer and prevents the wafer from being warped, chipped, and cracked.

In the case where the peripheral portion of the beck surface of the wafer is kept thick, an annular protruding portion is left on the peripheral portion of the wafer. To singulate (wafer dicing) the wafer having the annular protruding portion, a dicing tape supported by a ring frame needs to be attached to the back surface of the wafer to fix the wafer thereto. Patent literature 1 discloses a method for accurately attaching a dicing tape to a wafer having an annular protruding portion on the periphery of the back surface.

PRIOR ART

Patent Literature

Patent Literature 1: Japanese Patent Laid-Open No. 2013-232582

SUMMARY

Technical Problem

In wet etching performed after a central portion of a back surface of a wafer is mechanically ground, chemical liquid flows on the annular protruding portion of the wafer to produce the unevenness of the surface of the annular protruding portion. In the case where a dicing tape is attached to the wafer having an uneven surface on the annular protruding portion, the annular protruding portion and the dicing tape do not firmly adhere to each other. Thus, air enters a gap between the annular protruding portion and the dicing tape and may cause the dicing tape to be detached from the wafer. If the dicing tape is partially detached from the wafer, the wafer may be chipped or cracked in a dicing step. This causes a low yield problem.

The present invention has been accomplished to solve the above-described problem, and an object of the present invention is to provide a semiconductor device manufacturing method which can prevent a dicing tape from being detached from a wafer.

Means for Solving the Problems

According to a present invention, a semiconductor device manufacturing method includes thinning a wafer to form a wafer having an annular protruding portion on a peripheral portion thereof by grinding a central portion of a back surface of the wafer and then performing wet etching on the back surface of the wafer, forming a backside electrode on the back surface of the wafer, performing plating to evenly form a metal film on a portion of the backside electrode on the annular protruding portion, attaching a dicing tape to the metal film, and dicing the wafer having the dicing tape attached thereto.

Other features of the present invention will be made clear below.

Advantageous Effects of Invention

This invention allows an even metal film to be formed on an annular protruding portion of a wafer by plating, and can prevent a dicing tape from being detached from the wafer.

DESCRIPTION OF EMBODIMENTS

A semiconductor device manufacturing method according to an embodiment of the present invention will be described with reference to the drawings. The same or corresponding components will be denoted by the same reference signs, and the repetition of explanation thereof may be omitted.

Embodiment

Figure 1:
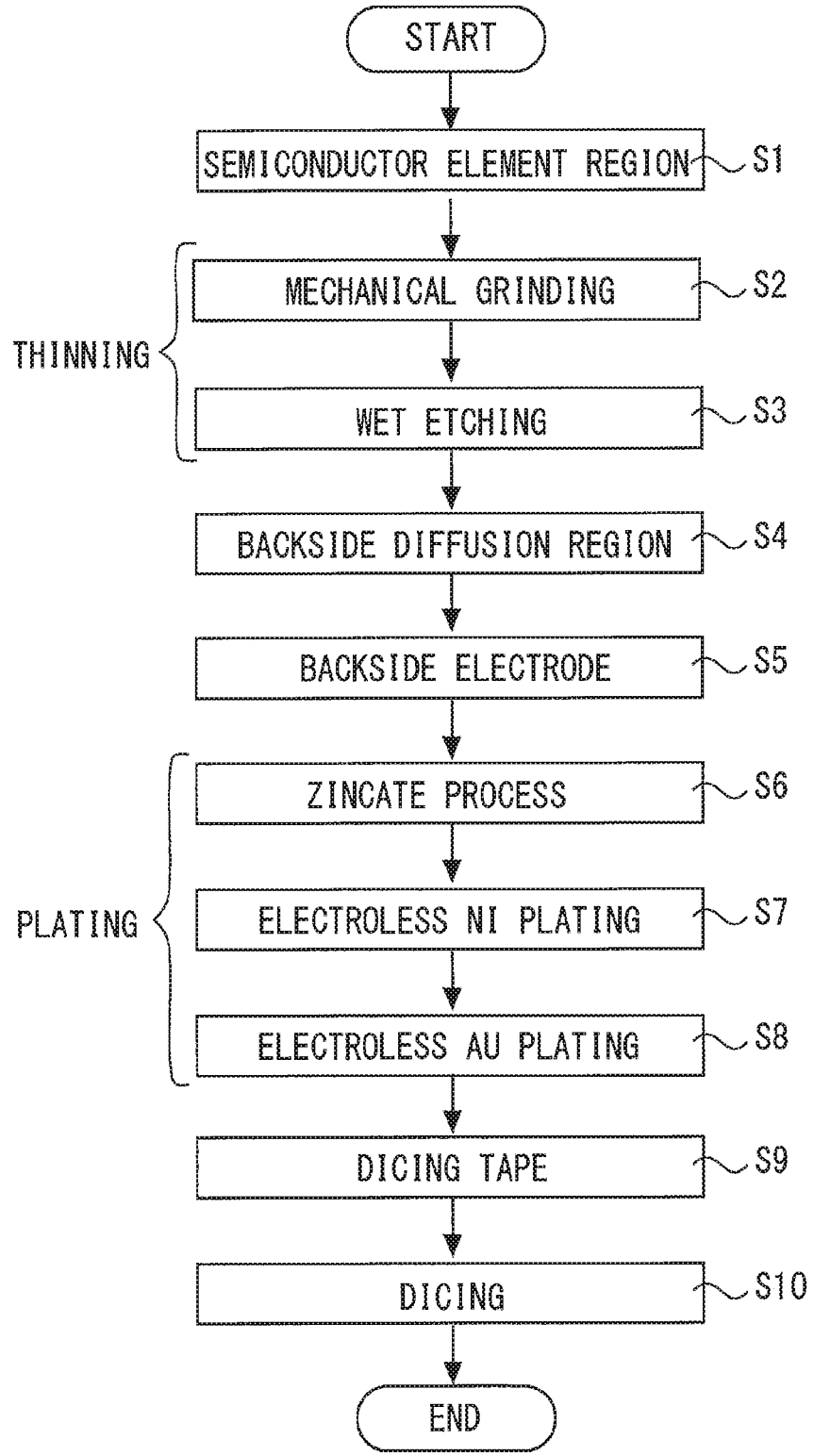
FIG. 1 is a flowchart showing a semiconductor device manufacturing method according to an embodiment.
Figure 2:
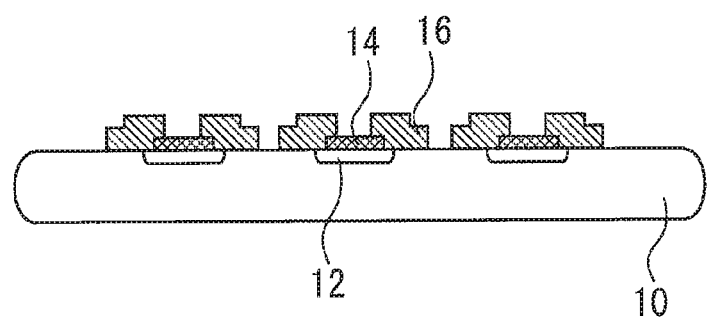
FIG. 2 is a cross-sectional view of a wafer having semiconductor element regions formed therein.

FIG. 1 is a flowchart showing a semiconductor device manufacturing method according to an embodiment of the present invention. First, semiconductor element regions are formed in a wafer (step S1). FIG. 2 is a cross-sectional view of a wafer 10 having semiconductor element regions 12 formed therein. The material of wafer 10 may be, but not limited to, Si, for example. The semiconductor element regions 12 are formed on a front side of the wafer 10. The semiconductor element regions 12 are diffusion layers. In step S1, in addition to the semiconductor element regions 12, surface electrodes 14 and protective films 16 covering edges of the surface electrodes 14 are formed on the front side of the wafer 10. The surface electrodes 14 are made of, for example, Al alloy. The protective films 16 are made of, for example, polyimide.

Figure 3:
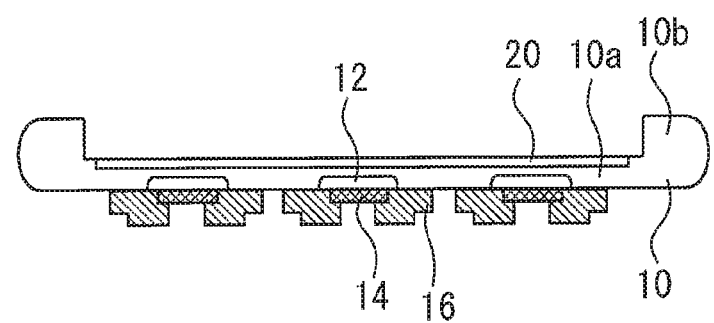
FIG. 3 is a cross-sectional view of the wafer having the central portion of the back surface thereof ground.

Subsequently, step S2 is performed. In step S2, a central portion of a back surface of the wafer is ground. FIG. 3 is a cross-sectional view of the wafer 10 having the central portion of the back surface thereof ground. In FIG. 3, the back surface of the wafer 10 faces up, and the front surface of the wafer 10 faces down. A publicly known mechanical grinder is used to grind the wafer 10. While a central portion 10a of the back surface of the wafer 10 is ground to become thin, a peripheral portion (annular protruding portion 10b) of the wafer 10 is not ground and has a thickness larger than that of the central portion 10a.

Subsequently, step S3 is performed. In step S3, to remove a defect layer produced by the above-described mechanical grinding, the back surface of the wafer is wet etched. Preferably, the amount of wet etching is approximately 5 to 20 μm. Thus, the wafer 10 having the annular protruding portion 10b on the peripheral portion thereof is prepared. Steps S2 and S3 constitute the step of thinning the wafer.

Subsequently, step S4 is performed. In step S4, a backside diffusion region is formed on the back side of the wafer. In FIG. 3, a backside diffusion region 20 is shown.

Figure 4:
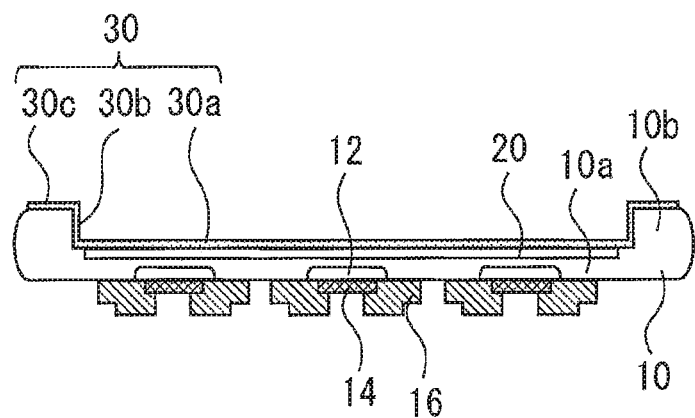
FIG. 4 is a cross-sectional view of the wafer having a backside electrode formed thereon.

Subsequently, step S5 is performed. In step S5, a backside electrode is formed on the back surface of the wafer 10. FIG. 4 is a cross-sectional view of the wafer 10 having a backside electrode 30 formed thereon. The backside electrode 30 is formed by depositing a layer of Al alloy such as AlSi or AlCu by, for example, sputtering. The backside electrode 30 may be a layer made of a material other than Al alloy. The thickness of the backside electrode 30 (Al alloy layer) is preferably 1 μm or more. The backside electrode 30 includes a portion 30a on the central portion 10a of the wafer 10, a portion 30b formed on a wall surface produced by grinding, and a portion 30c on the annular protruding portion 10b. In other words, the backside electrode 30 is formed on the entire back surface of the wafer 10.

Subsequently, step S6 is performed. In step S6, first, the wafer is immersed in an alkaline degreasing solution to remove grease and organic materials from the surface of the backside electrode 30 (Al alloy layer). Then, the wafer is immersed in hydrochloric acid to remove oxides formed on the surface of the backside electrode 30 (Al alloy layer). After that, a zincate process is performed on the wafer. The zincate process is a process that causes Zn to be deposited on the surface of the backside electrode 30 made of Al alloy by displacement. Details of the zincate process will be described below.

The wafer 10 is immersed in an (alkaline) zincate solution to deposit Zn on the surface of the backside electrode 30 (Al alloy layer) by displacement. After that, the deposited Zn is removed by, for example, nitric acid. Then, the wafer 10 is immersed in a zincate solution again to deposit Zn on the surface of the backside electrode 30 (Al alloy layer) by displacement. In this way, the zincate process is performed twice. The above-described treatment planarizes the backside electrode 30 (Al alloy layer), and causes Zn to be evenly deposited on the planarized backside electrode 30. It should be noted that forming the backside electrode 30 to a thickness of 1 μm or more as described previously makes it possible to avoid the complete loss of the backside electrode 30 by the treatment of step S6.

Figure 5:
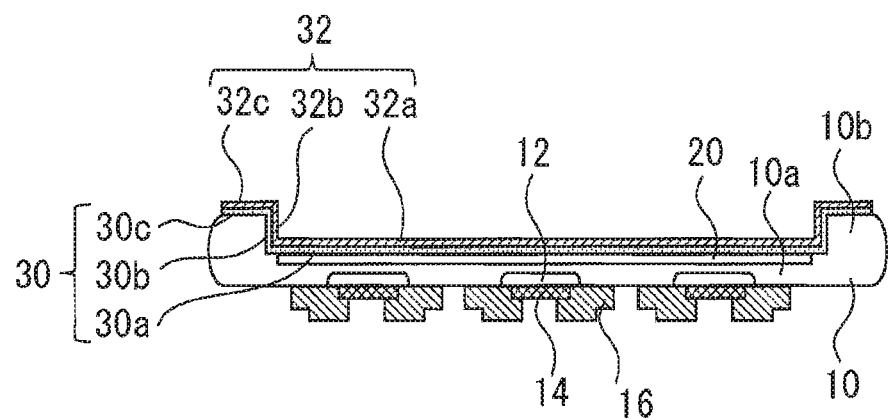
FIG. 5 is a cross-sectional view of the wafer having Zn deposited by displacement.

FIG. 5 is a cross-sectional view of the wafer having Zn deposited by displacement by the zincate process. A Zn film 32 is in contact with the backside electrode 30. The Zn film 32 includes a portion 32a on the central portion 10a of the wafer 10, a portion 32b formed on the wall surface produced by grinding, and a portion 32c on the annular protruding portion 10b.

Subsequently, step S7 is performed. In step S7, the wafer is immersed in an acidic electroless Ni plating solution. This causes a Ni film to be evenly deposited on the backside electrode 30 planarized by performing the aforementioned zincate process twice. Specifically, first, a Ni film is deposited on the surface of the backside electrode 30 (Al alloy layer) by displacement of Zn by Ni, and then Ni is deposited by reduction with a reducing agent contained in the electroless Ni plating solution. In this way, the formation of a Ni film starts at Zn.

Figure 6:
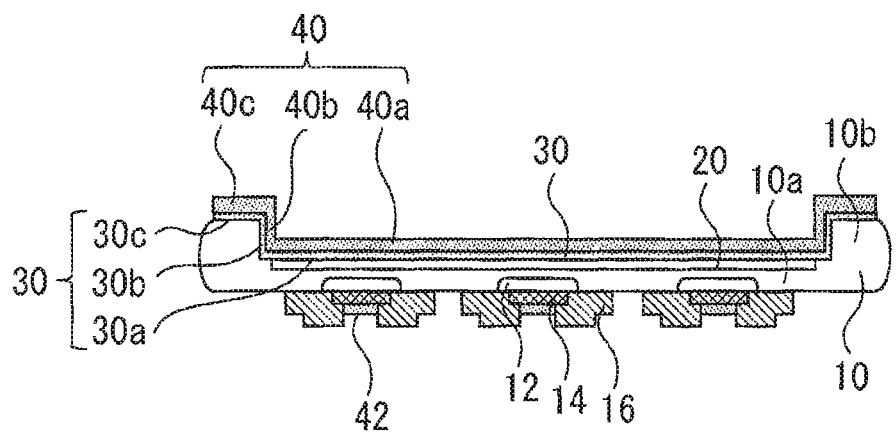
FIG. 6 is a cross-sectional view of the wafer having a Ni film formed thereon.

FIG. 6 is a cross-sectional view of the wafer 10 having a Ni film 40 formed thereon. The Ni film 40 includes a portion 40a over the central portion 10a of the wafer 10, a portion 40b formed over the wall surface produced by grinding, and a portion 40c formed over the annular protruding portion 10b. The deposition of the Ni film 40 spherically (radially) proceeds, and the surfaces of the portions 40a, 40b, and 40c form a smooth shape. Simultaneously with the formation of the Ni film 40, a Ni film 42 is formed on the front side of the wafer 10.

The thickness of the Ni film 40 is preferably 2 to 10 μm in view of film stress on the wafer 10, depending on the thickness by which the wafer is etched by the aforementioned wet etching (degree of surface unevenness). Plating can easily form a thick film having a thickness at a level of several micrometers.

Figure 7:
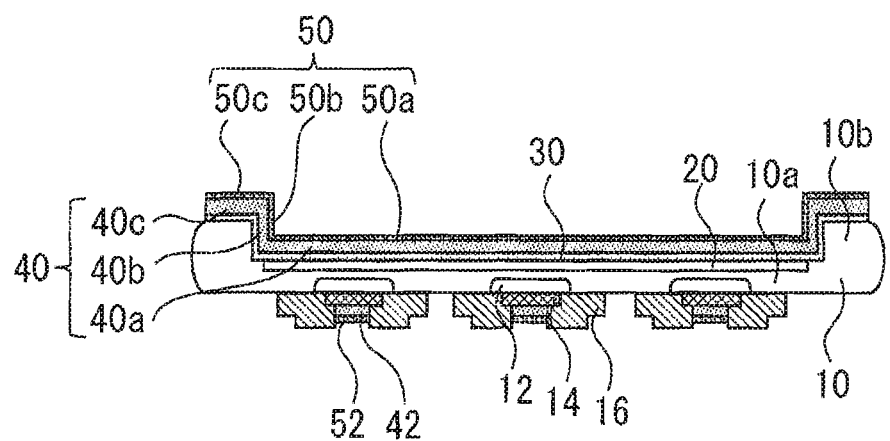
FIG. 7 is a cross-sectional view of the wafer having a Au film formed thereon.

Subsequently, step S8 is performed. In step S8, the wafer is immersed in an electroless Au plating solution. This causes a Au film to be formed on a Ni film. FIG. 7 is a cross-sectional view of the wafer 10 having a Au film 50 formed thereon. The Au film 50 is formed on the Ni film 40. The Au film 50 includes a portion 50a over the central portion 10a of the wafer 10, a portion 50b formed over the wall surface produced by grinding, and a portion 50c over the annular protruding portion 10b. The thickness of the Au film 50 is preferably 20 to 100 nm. Simultaneously with the formation of the Au film 50, a Au film 52 is formed on the front side of the wafer. The Au film 52 is formed on the Ni film 42. The Au films 50 and 52 are mainly intended to prevent the Ni films 40 and 42 from being oxidized. The thicknesses of the Au films 50 and 52 may be, but not limited to, 20 to 100 nm, for example.

Forming the Ni film 40 and the Au film 50 by plating after the zincate process as described above enables the Ni film 40 and the Au film 50 to be evenly formed on the back surface of the wafer 10. It should be noted that the steps from step S6 to step S8 are referred to as a plating step.

Figure 8:
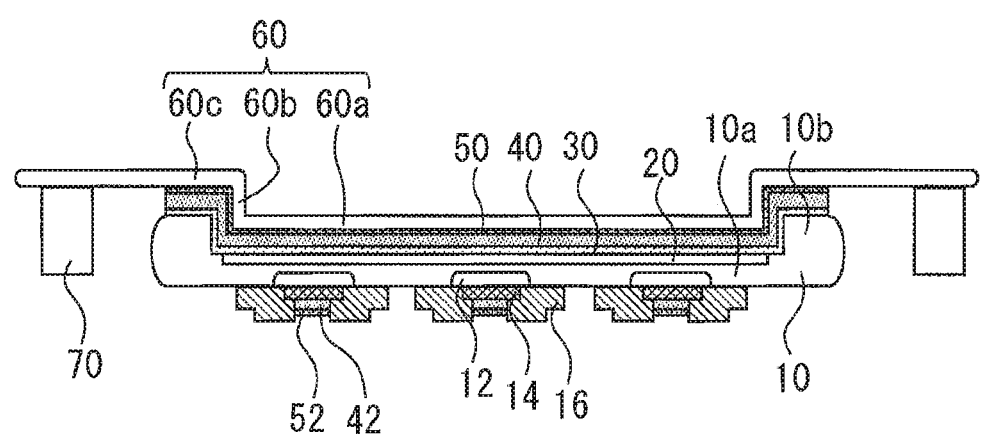
FIG. 8 is a cross-sectional view of the wafer having a dicing tape attached thereto.

Subsequently, step S9 is performed. In step S9, a dicing tape is attached to the Au film 50, which is a metal film. This step is referred to as an attaching step. FIG. 8 is a cross-sectional view of the wafer 10 having a dicing tape 60 attached thereto. The dicing tape 60 is supported by a ring frame 70. The dicing tape 60 is attached to the entire surface of the Au film 50. The dicing tape 60 includes a portion 60a over the central portion 10a of the wafer, a portion 60b provided over the wall surface produced by grinding, and a portion 60c over the annular protruding portion 10b. The backside electrode 30, the Ni film 40, and the Au film 50 which are on the annular protruding portion 10b form a smooth surface, and the Au film 50 and the dicing tape 60 can be made to firmly adhere to each other.

Subsequently, step S10 is performed. Step S10 is a dicing step for dicing the wafer 10 having the dicing tape 60 attached thereto. Performing the dicing step produces a plurality of singulated chips.

In the semiconductor device manufacturing method according to the embodiment of the present invention, metal films (Ni film 40 and Au film 50) are evenly formed on the back surface of the wafer 10 by plating. Accordingly, the back side of the wafer 10 becomes planarized, and the dicing tape 60 can be prevented from being detached from the wafer 10. Moreover, though the backside electrode 30 having poor flatness is formed on the annular protruding portion 10b having poor flatness due to wet etching, the flatness of the backside electrode 30 can be improved by performing the zincate process twice. Accordingly, the flatnesses of the Ni film 40 and the Au film 50, which are formed on the backside electrode 30, are also improved, and the dicing tape attached to the Au film 50 firmly adheres to the Au film 50. Thus, the dicing tape 60 can reliably be prevented from being detached from the wafer 10.

The semiconductor device manufacturing method according to the embodiment of the present invention can be variously modified. For example, while a Ni film and a Au film are formed on the backside electrode 30 in the above-described example, a film of other material may be formed on the backside electrode 30 by plating. A flat and smooth metal film can be provided on the annular protruding portion by forming an even metal film on the backside electrode 30 by plating.

If there is a region where no plated film is desired, a plating process may be performed after such a region is protected by a PET film or the like in advance. For example, the Ni film 40 is formed after a PET film or the like is attached to the front side of the wafer.

In the manufacturing method of the embodiment, the Ni film 40 is formed after a zincate process is performed on the backside electrode 30 made of Al alloy. However, a material other than Al alloy may be selected as a material for the backside electrode, and the flatness of the backside electrode may be improved by a method other than a zincate process. Moreover, since evenly forming a metal film on the backside electrode by plating provides a certain degree of flatness, a step for improving the flatness of the backside electrode 30 such as a zincate process may be omitted.

To prevent the dicing tape from being detached from the wafer, making the dicing tape 60 and the annular protruding portion 10b of the wafer 10 firmly adhere to each other is important. Accordingly, a metal film may be formed only on the annular protruding portion by plating. Forming an even metal film having excellent flatness by performing a plating process on the annular protruding portion enables the dicing tape 60 to firmly adhere to the annular protruding portion 10b.

DESCRIPTION OF SYMBOLS 10 wafer, 10a central portion, 10b annular protruding portion, 12 semiconductor element region, 14 surface electrode, 16 protective film, 20 backside diffusion region, 30 backside electrode, 32 Zn film, 40 Ni film, 50 Au film, 60 dicing tape

The invention claimed is:

1. A semiconductor device manufacturing method comprising:
    forming a surface electrode and a protective film covering only a portion of the surface electrode on a front surface of a wafer, such that another portion of the surface electrode is exposed,
    thinning the wafer to form a wafer having an annular protruding portion on a peripheral portion thereof by grinding a central portion of a back surface of the wafer and then performing wet etching on the back surface of the wafer;
    forming a backside electrode directly on the back surface of the wafer;
    performing plating by immersing the wafer into a solution to evenly form a metal film on a portion of the backside electrode on the annular protruding portion and on the exposed another portion of the surface electrode;
    attaching a dicing tape to the metal film; and
    dicing the wafer having the dicing tape attached thereto, wherein
    the backside electrode is an Al alloy layer, and
    in the plating, the wafer is immersed in a zincate solution to deposit Zn on a surface of the Al alloy layer by displacement, the deposited Zn is removed, then the wafer is immersed in a zincate solution again to deposit Zn on the surface of the Al alloy layer by displacement, and subsequently the wafer is immersed in an electroless Ni plating solution, and after the wafer is immersed in the electroless Ni plating solution, the wafer is immersed in an electroless Au plating solution, and
    the metal film includes a portion formed over an inner wall surface of the annular protruding portion and provided closer to an edge of the wafer than the protective film.

2. The semiconductor device manufacturing method according to claim 1, wherein the metal film includes a Ni film formed by immersing the wafer in the electroless Ni plating solution and has a thickness ranging from 2 to 10 μm.

3. The semiconductor device manufacturing method according to claim 1, wherein the metal film includes a Au film formed by immersing the wafer in the electroless Au plating solution and has a thickness ranging from 20 to 100 nm.

4. The semiconductor device manufacturing method according to claim 1, wherein the Al alloy layer has a thickness of 1 μm or more.

5. The semiconductor device manufacturing method according to claim 1, wherein in the plating, before the wafer is immersed in the zincate solution, the wafer is immersed in an alkaline degreasing solution and then in hydrochloric acid.

* * * * *